United States Patent
Chyi et al.

(10) Patent No.: US 8,679,881 B1
(45) Date of Patent: Mar. 25, 2014

(54) GROWTH METHOD FOR REDUCING DEFECT DENSITY OF GALLIUM NITRIDE

(71) Applicant: Tekcore Co., Ltd., Nantou (TW)

(72) Inventors: Jen-Inn Chyi, Jung-li (TW);
Lung-Chieh Cheng, Jung-li (TW);
Hsueh-Hsing Liu, Jung-li (TW);
Geng-Yen Lee, Jung-li (TW)

(73) Assignee: Tekcore Co., Ltd., Nantou (TW)

(*) Notice: Subject to any disclaimer, the term of this patent is extended or adjusted under 35 U.S.C. 154(b) by 0 days.

(21) Appl. No.: 13/934,846

(22) Filed: Jul. 3, 2013

(30) Foreign Application Priority Data

Mar. 25, 2013 (TW) .............................. 102110457 A

(51) Int. Cl.
*H01L 21/00* (2006.01)
(52) U.S. Cl.
USPC .................................. 438/39; 438/40; 438/46
(58) Field of Classification Search
USPC .............. 438/39, 40, 41, 42, 46, 47
See application file for complete search history.

(56) References Cited

U.S. PATENT DOCUMENTS

| 6,673,149 B1* | 1/2004 | Solomon et al. ................. 117/90 |
| 7,560,296 B2* | 7/2009 | Frayssinet et al. .............. 438/22 |
| 8,283,239 B2* | 10/2012 | Beaumont et al. ............ 438/478 |
| 2012/0205616 A1* | 8/2012 | Zhang et al. .................... 257/13 |

FOREIGN PATENT DOCUMENTS

EP 1054442 11/2000

* cited by examiner

*Primary Examiner* — Kevin M Picardat
(74) *Attorney, Agent, or Firm* — Muncy, Geissler, Olds & Lowe, P.C.

(57) ABSTRACT

A growth method for reducing defect density of GaN includes steps of: sequentially forming a buffer growth layer, a stress release layer and a first nanometer cover layer on a substrate, wherein the first nanometer cover layer has multiple openings interconnected with the stress release layer; growing a first island in each of the openings; growing a first buffer layer and a second nanometer cover layer on the first island; and growing a second island to form a dislocated island structure. Thus, through the first nanometer cover layer and the second nanometer cover layer, multiple dislocated island structures can be directly formed to reduce manufacturing complexity as well as increase yield rate by decreasing manufacturing environment variation. Further, the epitaxial lateral over growth (ELOG) approach also effectively enhances characteristics of GaN optoelectronic semiconductor elements.

10 Claims, 4 Drawing Sheets

GROWTH METHOD FOR REDUCING DEFECT DENSITY OF GALLIUM NITRIDE

FIELD OF THE INVENTION

The present invention relates to a growth method of a light-emitting diode (LED), and particularly to a growth method for reducing defect density of gallium nitride (GaN).

BACKGROUND OF THE INVENTION

III-V compounds are frequently adopted in the manufacturing of light-emitting diodes (LEDs). Among the III-V compounds, gallium nitride (GaN)-based materials, featuring advantages of direct bandgap, wide bandgap, high-strength chemical bonding and good anti-radiation strength, are extensively developed and thus prevail in blue/green to ultraviolet light-emitting elements as well as high-power and high-temperature electronic elements in the recent years.

Currently, as large-sized GaN wafers cannot be fabricated, most GaN semiconductors need to employ a substrate having a substantial amount of lattice mismatch as GaN. Due to the strain caused by lattice mismatch between a substrate and epitaxial thin-films, misfit dislocation is often generated. Further, a stereotypic optoelectronic element is usually a heterostructure, in which strain energy are easily accumulated on the heterojunction due to lattice mismatch and thermal expansion coefficient difference between epitaxial layers. The strain energy often causes misfit dislocation during processes of manufacturing and utilizing elements. The misfit dislocation defects usually generate and begin from a heterojunction, and become traps or recombination centers for minority carriers at active regions of the element to degrade characteristics and quality of such semiconductor elements. For example, in an LED, the existence of dislocation defects causes excess carriers not to release energy in form of radiative recombination, such that the light-emitting efficiency of the LED is undesirably affected.

Due to the lack of a substrate having a lattice constant that completely matches GaN, GaN thin-films are mostly grown by heteroepitaxial growth. Taking a most prevalent aluminum oxide substrate for example, physical and chemical properties of the aluminum oxide substrate are quite stable. However, lattice mismatch between the aluminum oxide substrate and a GaN thin-film is approximately 16%, which results in a high defect density of the GaN thin-film on the aluminum oxide substrate. To effectively reduce a dislocation density, many methods have been raised by researchers and developers for solving the problem. The epitaxial lateral over growth (ELOG) technique is a common method for solving the above problem. For example, the EP publication No. 1054442, "Method for Growing Epitaxial Group III Nitride Compound Semiconductors on Silicon", discloses a method for growing aluminum gallium nitride on a silicon substrate by using the ELOG technique for mitigating the issue of misfit dislocation.

Lithography and etching processes are required during the growth of GaN using the ELOG method, and so different manufacturing machines are involved in the overall manufacturing process. Thus, not only the overall manufacturing process is complicated, but also a yield rate is reduced owing to environmental factors among different machines to further cause increased production costs.

SUMMARY OF THE INVENTION

Therefore the primary object of the present invention is to overcome the above issues of a complicated manufacturing process and a reduced yield rate caused by environmental factors among different machines.

To achieve the above object, a growth method for reducing defect density of GaN is provided by the present invention. The growth method comprises the following steps.

In step S1, a buffer growth layer and a stress release layer are sequentially formed on a substrate.

In step S2, a first nanometer cover layer is formed on the stress release layer. The first nanometer cover layer has a plurality of openings interconnected with the stress release layer.

In step S3, a first island is grown in each of the openings. The first island has an annular tilted wall adjacent to the opening, and a top wall formed away from the first nanometer cover layer and connected to the tilted wall.

In step S4, a first buffer layer is formed on surfaces of the first nanometer cover layer and the first island.

In step S5, a second nanometer cover layer is formed at a position of the first buffer layer corresponding to the top wall, and a position of the first buffer layer not covered by the second nanometer cover layer is defined as a connection growth region.

In step S6, a second island is grown and formed on the connection growth region.

In step S7, a second buffer layer is formed on surfaces of the second nanometer cover layer and the second island.

In step S8, the growth of a dislocated island structure is completed.

In step S9, a nitride semiconductor layer is formed on the dislocated island structure which is a buffer for reducing defect density.

In conclusion, the present invention offers at least the advantages below.

First of all, through the first nanometer cover layer and the second nanometer cover layer, multiple dislocated island structures can be directly formed to mitigate the defect density issue in a GaN semiconductor.

Secondly, by use of the ELOG technique, edge type dislocation and screw type dislocation in GaN semiconductors can be reduced to effectively enhance characteristics of GaN optoelectronic semiconductor elements.

The foregoing, as well as additional objects, features and advantages of the invention will be more readily apparent from the following detailed description, which proceeds with reference to the accompanying drawings.

DETAILED DESCRIPTION OF THE PREFERRED EMBODIMENTS

Figure 1:
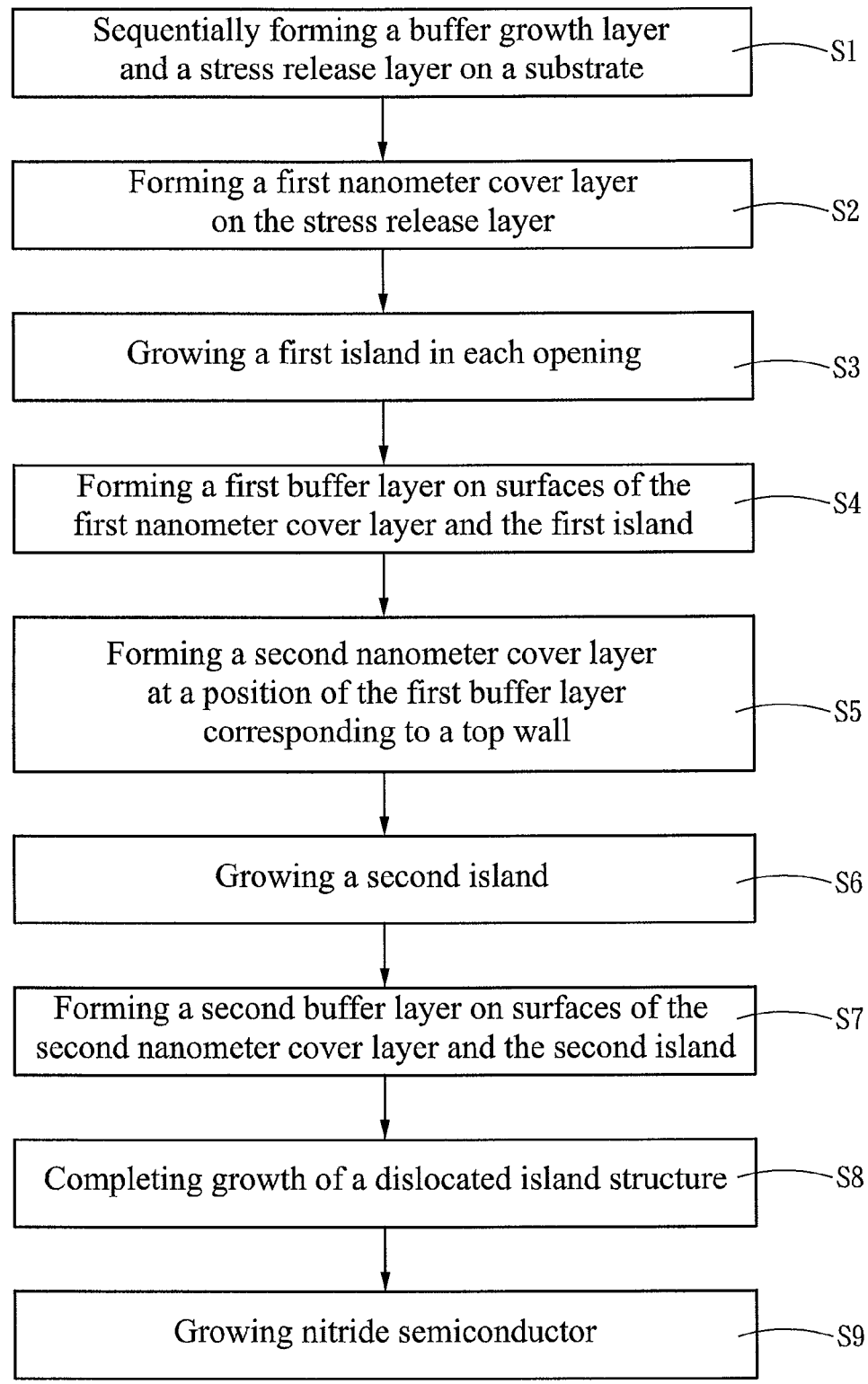
FIG. 1 is a flowchart of a growing method of the present invention.

With reference to FIGS. 1, and 2A to 2E, a growth method for reducing a gallium nitride (GaN) detect density of the present invention comprises the following steps.

In step S1, a buffer growth layer 11 and a stress release layer 12 are sequentially formed on a substrate 10. For example, the substrate 10 may be made of aluminum oxide ($Al_2O_3$, also referred to as sapphire), silicon (Si), gallium arsenide (GaAs), or silicon carbide (SiC). The buffer growth layer 11 comprises a low-temperature buffer growth layer 111 having a thickness of approximately 200 nm grown in a low temperature of 600° C. to 900° C., and a high-temperature buffer growth layer 112 having a thickness of 60 nm to 400 nm grown in a high temperature of 1000° C. to 1200° C. In the embodiment, the low-temperature buffer growth layer 111 and the high-temperature buffer growth layer 112 may be aluminum nitride (AlN). For example, the stress release layer 12 may be made of GaN, AlN or aluminum gallium nitride ($Al_xGa_{1-x}N$, where 0<x<1), and grown at a temperature of approximately 900° C. to 1200° C.

Figure 2A:
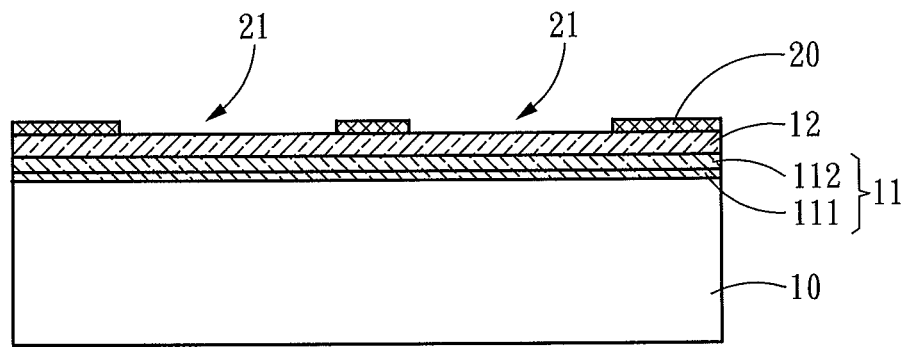
FIGS. 2A to 2E are schematic diagrams of a growing method and a structure of the present invention.

In step S2, a first nanometer cover layer 20 is formed on the stress release layer 12. Referring to FIG. 2A, the first nanometer cover layer 20 has a plurality of openings 21 interconnected with the stress release layer 12, may be made of Si, and has a thickness of 1 nm to 10 nm. In the present invention, the first nanometer cover layer 20 is manufactured by a metal-organic chemical vapor deposition (MOCVD) process. Under conditions of the MOCVD process, without requiring additional manufacturing processes or machines, the first nanometer cover layer 20 having the openings 21 can be formed through controlling environmental conditions, so as to simplify the overall manufacturing process.

Figure 2B:
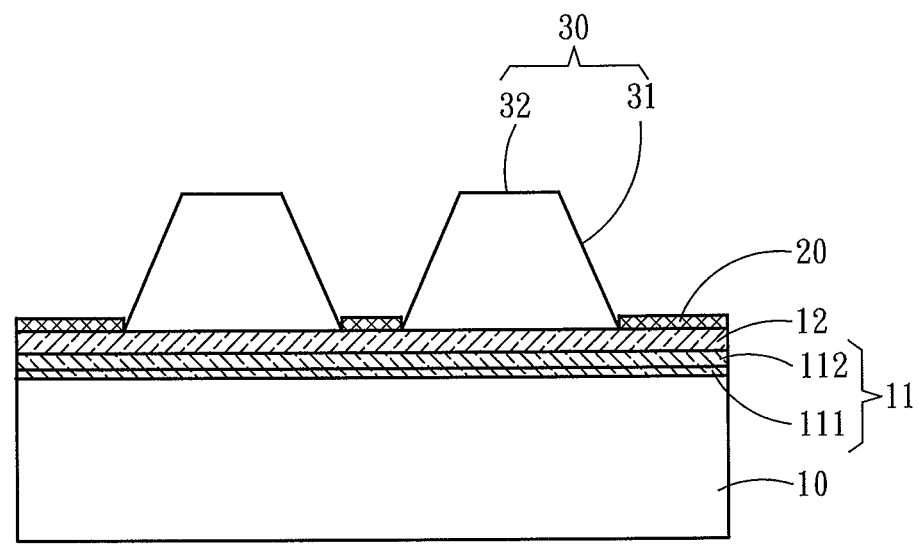

In step S3, a first island 30 is grown in each of the openings 21. Referring to FIG. 2B, the first island 30 has an annular tilted wall 31 adjacent to the opening 21, and a top wall 32 formed away from the first nanometer cover layer 20 and connected to the tilted wall 31.

For example, the first island 30 may be made of GaN or $Al_xGa_{1-x}N$ and grown at a temperature of 1000° C. to 1200° C.

Figure 2C:
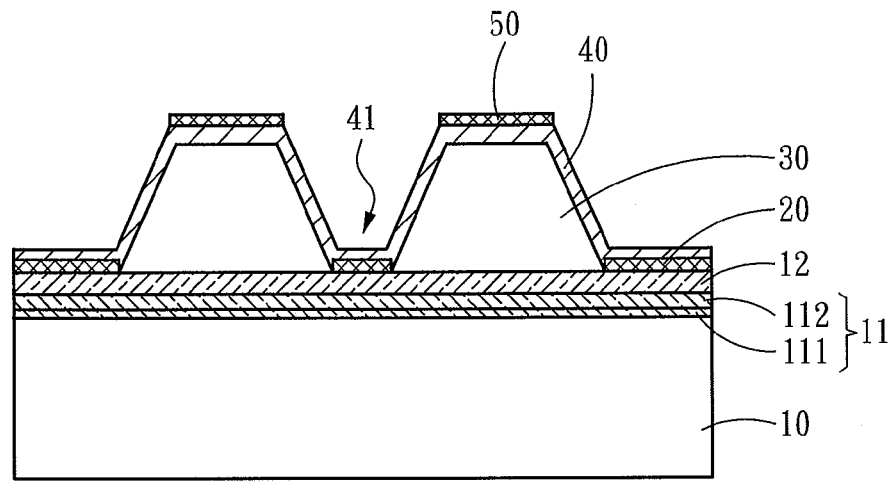

In step S4, a first buffer layer 40 is formed on surfaces of the first nanometer cover layer 20 and the first island 30. Referring to FIG. 2C, the first buffer layer 40 may be made of AlN or $Al_xGa_{1-x}N$ and grown at a temperature of 700° C. to 1200° C. to a thickness of 60 nm to 400 nm.

In step S5, a second nanometer cover layer 50 is formed at a position of the first buffer layer 40 corresponding to the top wall 32, and a position of the first buffer layer 40 not covered by the second nanometer cover layer 50 is defined as a connection growth region 41. For example, the second nanometer cover layer 50 may be made of SiN having a thickness of 1 to 10 nm. Further, the second nanometer cover layer 50 may be grown at a temperature of 1000° C. to 1200° C.

Figure 2D:
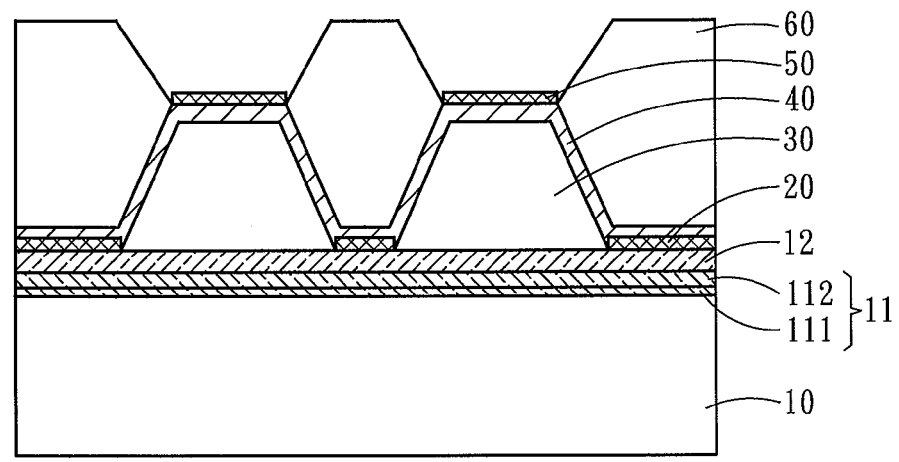

In step S6, a second island 60 is grown. Referring to FIG. 2D, the second island 60 is formed on the connection growth region 41 at a temperature of 1000° C. to 1200° C. The second island 60 may be made of a same material as that of the first island 30, i.e., GaN or $Al_xGa_{1-x}N$. Further, a shape of the second island 60 is formed with adaptation to a dented shape of the connection growth region 41. After the second island 60 is grown at an elevation higher than the position of the top wall 32, it is grown in a shape with a gradually wider bottom as the first island 30.

Figure 2E:
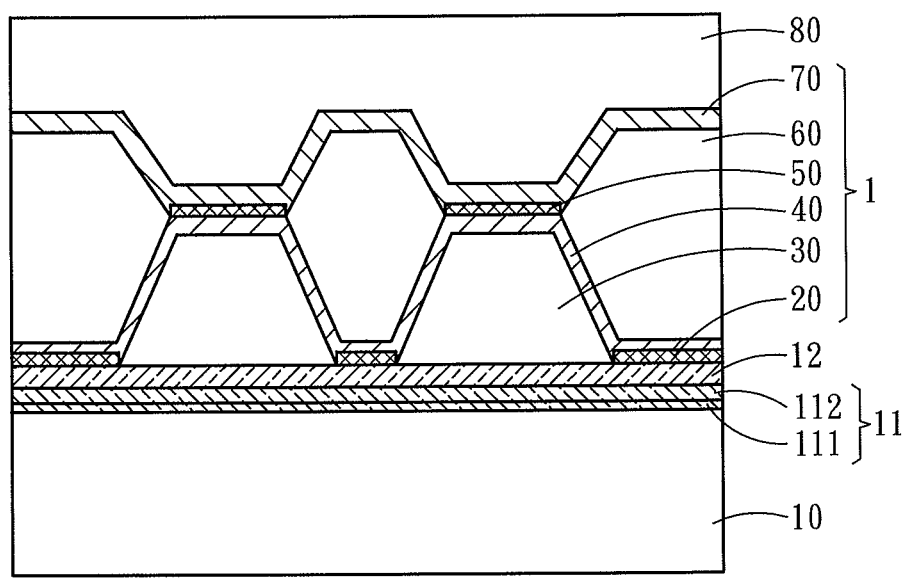

In step S7, a second buffer layer 70 is formed on surfaces of the second nanometer cover layer 50 and the second island 60. Referring to FIG. 2E, the second buffer layer 70 may be made of a same material as that of the first buffer layer 40, has a thickness of 10 nm to 40 nm, and is grown in a low-temperature method at a temperature of 600° C. to 900° C.

In step S8, the growth of one dislocated island structure 1 is complete. Through the above steps, the first island 30 and the second island 60 are completely formed, with the first island 30 and the second island 60 being arranged in a dislocated structure.

In step S9, a nitride semiconductor is formed. A nitride semiconductor layer 80 is formed on the dislocated island structure 1 which functions as a buffer for reducing defect density. For example, the nitride semiconductor layer 80 may made of zinc oxide (ZnO), GaN, AlN, indium nitride (InN), $Al_xGa_{1-x}N$, indium gallium nitride ($In_xGa_{1-x}N$, where 0<x<1), aluminum gallium indium nitride ($Al_xGa_yIn_{1-x-y}N$, where 0<x<1, 0<y<1, 0<x+y<1), or other materials having a close lattice constant.

It should be noted that, the dislocated island structure 1 of the present invention is illustrated merely by the first island 30 and the second island 60. In an alternative embodiment, a dislocated island structure having more than two layers may also be grown.

In conclusion, the present invention offers the advantages below.

First of all, through the first nanometer cover layer and the second nanometer cover layer, the dislocated island structure can be directly formed to mitigate the issue of the defect density in a GaN semiconductor.

Secondly, by use of the ELOG technique, edge type dislocation and screw type dislocation in GaN semiconductors can be reduced to effectively enhance characteristics of GaN optoelectronic semiconductor elements.

Further, the defect density can be similarly reduced without damaging the surface of the substrate. Moreover, by use of the MOCVD to manufacture the dislocated island structures, overall manufacturing complexity can be effectively simplified and the issue of the yield rate being affected by manufacturing environmental variation also can be alleviated.

What is claimed is:

1. A growth method for reducing defect density of gallium nitride (GaN), comprising steps of:
    S1: sequentially forming a buffer growth layer and a stress release layer on a substrate;
    S2: forming a first nanometer cover layer on the stress release layer, wherein the first nanometer cover layer includes a plurality of openings interconnected with the stress release layer;
    S3: growing a first island in each of the openings, wherein the first island includes an annular tilted wall adjacent to the opening, and a top wall away from the first nanometer cover layer and connected to the tilted wall;
    S4: forming a first buffer layer on surfaces of the first nanometer cover layer and the first island;
    S5: forming a second nanometer cover layer at a position of the first buffer layer corresponding to the top wall, and defining a position of the first buffer layer not covered by the second nanometer cover layer as a connection growth region;
    S6: growing a second island on the connection growth region;
    S7: forming a second buffer layer on surfaces of the second nanometer cover layer and the second island;
    S8: completing growth of a dislocated island structure; and
    S9: forming a nitride semiconductor layer on the dislocated island structure which is a buffer for reducing defect density.

2. The growth method of claim 1, wherein the substrate is made of a material selected from the group consisting of aluminum oxide ($Al_2O_3$), silicon (Si), gallium arsenide (GaAs), silicon carbide (SiC) and combinations thereof.

3. The growth method of claim 1, wherein the buffer growth layer comprises a low-temperature buffer growth layer and a high-temperature buffer growth layer; in the step S1, the low-temperature buffer growth layer is grown at a low temperature of 600° C. to 900° C., and the high-temperature buffer growth layer is grown at a high temperature of 1000° C. to 1200° C.

4. The growth method of claim 3, wherein the low-temperature buffer growth layer and the high-temperature buffer growth layer are made of aluminum nitride (AlN).

5. The growth method of claim 1, wherein the stress release layer is made of a material selected from the group consisting of gallium nitride (GaN), aluminum nitride (AlN), aluminum gallium nitride ($Al_xGa_{1-x}N$) and combinations thereof.

6. The growth method of claim 1, wherein the first nanometer cover layer and the second nanometer cover layer are made of silicon nitride (SiN).

7. The growth method of claim 1, wherein the first buffer layer and the second buffer layer are made of a material selected from the group consisting of aluminum nitride (AlN), aluminum gallium nitride ($Al_xGa_{1-x}N$) and a combination thereof.

8. The growth method of claim 1, wherein the first island and the second island are made of gallium nitride (GaN) or aluminum gallium nitride ($Al_xGa_{1-x}N$).

9. The growth method of claim 1, wherein the nitride semiconductor layer is made of a material selected from the group consisting of zinc oxide (ZnO), gallium nitride (GaN), aluminum nitride (AlN), indium nitride (InN), aluminum gallium nitride ($Al_xGa_{1-x}N$), indium gallium nitride ($In_xGa_{1-x}N$), aluminum gallium indium nitride ($Al_xGa_yIn_{1-x-y}N$) and combinations thereof.

10. The growth method of claim 1, wherein the first nanometer cover layer and the second nanometer cover layer are formed on the stress release layer and the first buffer layer by organic-metal chemical vapor deposition (MOCVD), respectively.

* * * * *